(12) United States Patent
Theobald

(10) Patent No.: US 9,766,846 B1
(45) Date of Patent: Sep. 19, 2017

(54) RECONFIGURABLE USER INPUT/OUTPUT DEVICE

(71) Applicant: Daniel Theobald, Somerville, MA (US)

(72) Inventor: Daniel Theobald, Somerville, MA (US)

( * ) Notice: Subject to any disclaimer, the term of this patent is extended or adjusted under 35 U.S.C. 154(b) by 266 days.

(21) Appl. No.: 14/172,056

(22) Filed: Feb. 4, 2014

Related U.S. Application Data

(63) Continuation of application No. 13/072,986, filed on Mar. 28, 2011, now abandoned.

(51) Int. Cl.
  *G06F 3/12* (2006.01)
  *H05K 7/00* (2006.01)
(52) U.S. Cl.
  CPC ............ *G06F 3/128* (2013.01); *G06F 3/1222* (2013.01); *H05K 7/00* (2013.01)

(58) Field of Classification Search
CPC combination set(s) only.
See application file for complete search history.

(56) References Cited

U.S. PATENT DOCUMENTS

| | | | |
|---|---|---|---|
| 2001/0021954 A1* | 9/2001 | Takamizawa et al. | 710/19 |
| 2005/0288571 A1* | 12/2005 | Perkins et al. | 600/407 |
| 2012/0197464 A1* | 8/2012 | Wang et al. | 701/2 |
| 2012/0197622 A1* | 8/2012 | Jain | 703/11 |

* cited by examiner

*Primary Examiner* — Idowu O Osifade
(74) *Attorney, Agent, or Firm* — Albert J. Brunett

(57) ABSTRACT

A readily reconfigurable self-contained self-service user input/output including an input/output assembly accessible by a user, the assembly being readily configurable to be used in more than one type of user configuration or application and at least one peripheral device removably secured in a desired position about the periphery of the assembly.

1 Claim, 7 Drawing Sheets

RECONFIGURABLE USER INPUT/OUTPUT DEVICE

RELATED APPLICATION

This application is a continuation of U.S. patent application Ser. No. 13/072,986 filed on Mar. 28, 2011.

FIELD OF THE INVENTION

The present invention relates generally to input/output devices, and more particularly to a versatile input/output device for users at a facility.

BACKGROUND OF THE INVENTION

User input/output devices take on a variety of forms, provide a number of functions and are becoming increasingly popular among both customers and facility owners for customer check-in or similar activities. Such devices may be referred to as a "kiosk" or "terminal" and typically provide limited features or functionality, cannot be modified or customized in the field after leaving the factory and face significant down time if a malfunction occurs, among other concerns.

SUMMARY OF THE INVENTION

A readily reconfigurable self-contained self-service user input/output device including an input/output assembly accessible by a user, the assembly being readily configurable to be used in more than one type of user configuration or application and at least one peripheral device removably secured in a desired position about the periphery of the assembly.

DESCRIPTION OF THE DRAWINGS

The following detailed description will be better understood when read in conjunction with the appended drawings, in which there is shown one or more of the multiple embodiments of the present disclosure. It should be understood, however, that the various embodiments of the present disclosure are not limited to the precise arrangements and instrumentalities shown in the drawings.

DESCRIPTION OF THE PREFERRED EMBODIMENTS

The present invention will be described in detail with reference to embodiments that represent examples of the present invention and are not intended to limit the scope of the invention. Although specific elements and configurations are described to provide an understanding of the invention, it is to be understood that the specific embodiments, elements and configurations provided are for illustrative purposes only. Other configurations will be recognized by those of ordinary skill in the art without departing from the teachings of the present invention or the scope of the appended claims.

Various facilities and organizations frequently require the presence of an individual, such as a customer, patient or the like, at the facility to obtain goods or services at the facility. Some examples of such facilities include, but are not limited to, a doctor's office, a medical clinic, a hospital, a bank, airline terminal, will-call desk, store, automotive service center, restaurant, veterinarians office, kennel or any other type of facility. It is to be understood that the particular facility itself can vary without departing from the teachings of the present invention.

In many of these facilities, the customer or patient has an initial check-in phase followed by one or more subsequent service phases and may have a pre-arranged appointment. Although initial check-in at a facility typically is handled by an administrative person at the facility, use of self-service type check-in equipment is becoming increasingly popular for a variety of reasons.

Self-service check-in equipment typically includes some type of user input/output device such as a kiosk, hand held device, cell phone, tablet PC or the like. Existing kiosks are usually quite limited in functional capabilities and are manufactured as bulky, immovable, stand-alone units with a set configuration and functional capability with little if any ability to make accommodations to the end users needs after it leaves the factory for customization or other purposes.

Additionally, in the event of a malfunction the entire kiosk typically is shut down until an experienced technician can arrive at the facility to work on the kiosk and hopefully bring the kiosk back on-line quickly. If not, significant additional time is lost waiting for a replacement kiosk which can be days if not weeks costing the kiosk customer additional money while using valuable human resources in the interim with potential facility customer inconvenience or annoyance.

Figure 1:
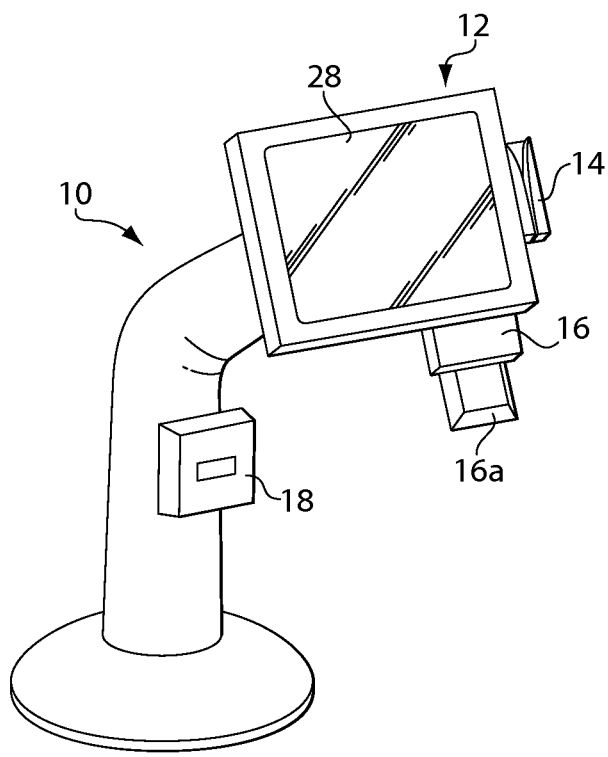
FIG. 1 is a perspective view generally illustrating one embodiment of a reconfigurable user input/output device of the present invention.

As FIG. 1 illustrates, the user input/output device of present invention is designated generally by the reference numeral 10. The device 10 is designed as a self-contained self-service user input/output assembly that can include all necessary components, readily be adapted for a variety of needs, is easily reconfigurable on-site by the customer to suit a variety of applications or needs as well as repairs without factory tech support, and provide a completely enclosed and secure structure, among other features.

The device 10 substantially includes a unique housing assembly 12 that serves to accommodate all of the desired electronics, hardware, software, wiring, ports and attachment mechanisms, including a CPU and various peripherals, for example. It is to be understood, however, that the present invention is not to be limited in any way by the particular hardware, software, peripherals or the like.

Figure 3:
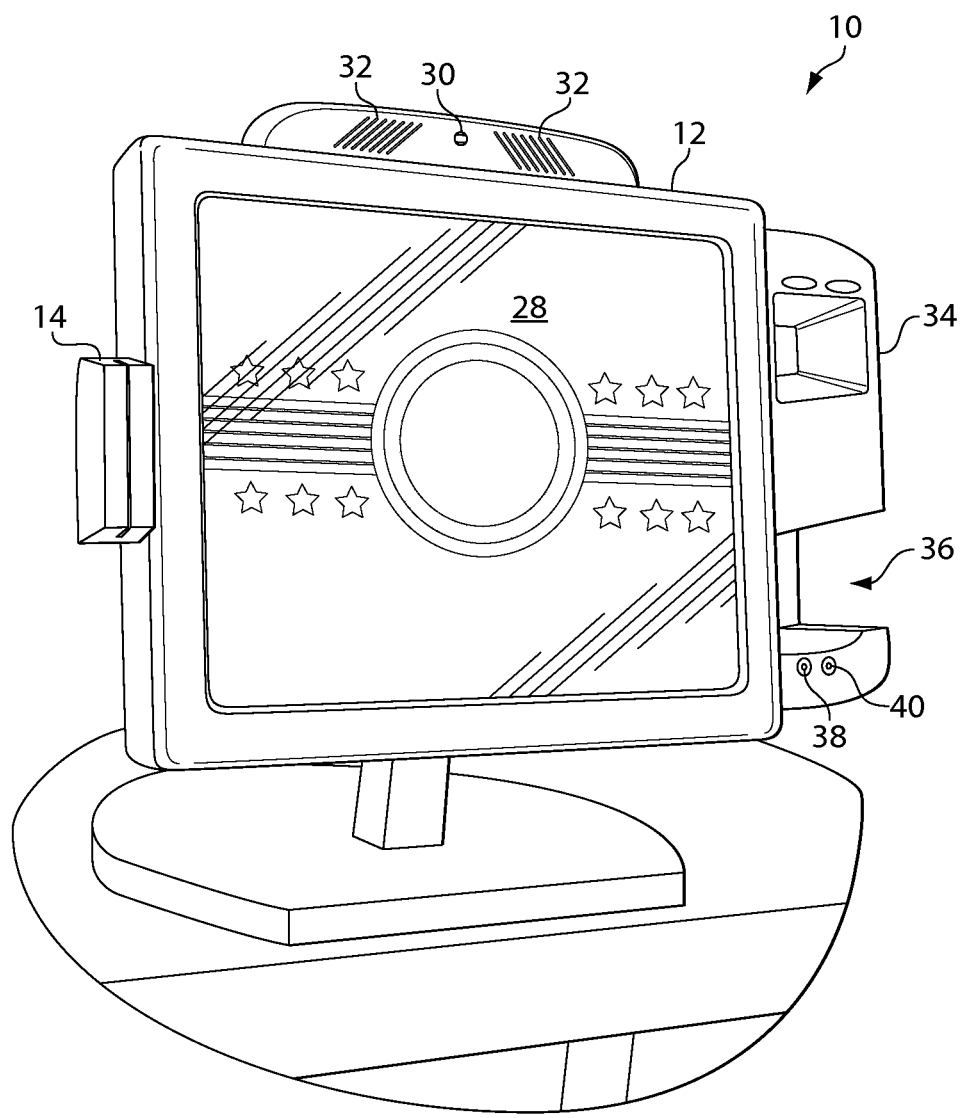
FIG. 3 is a perspective view generally illustrating another embodiment of a reconfigurable user input/output device of the present invention for use in a table top style of application.
Figure 4:
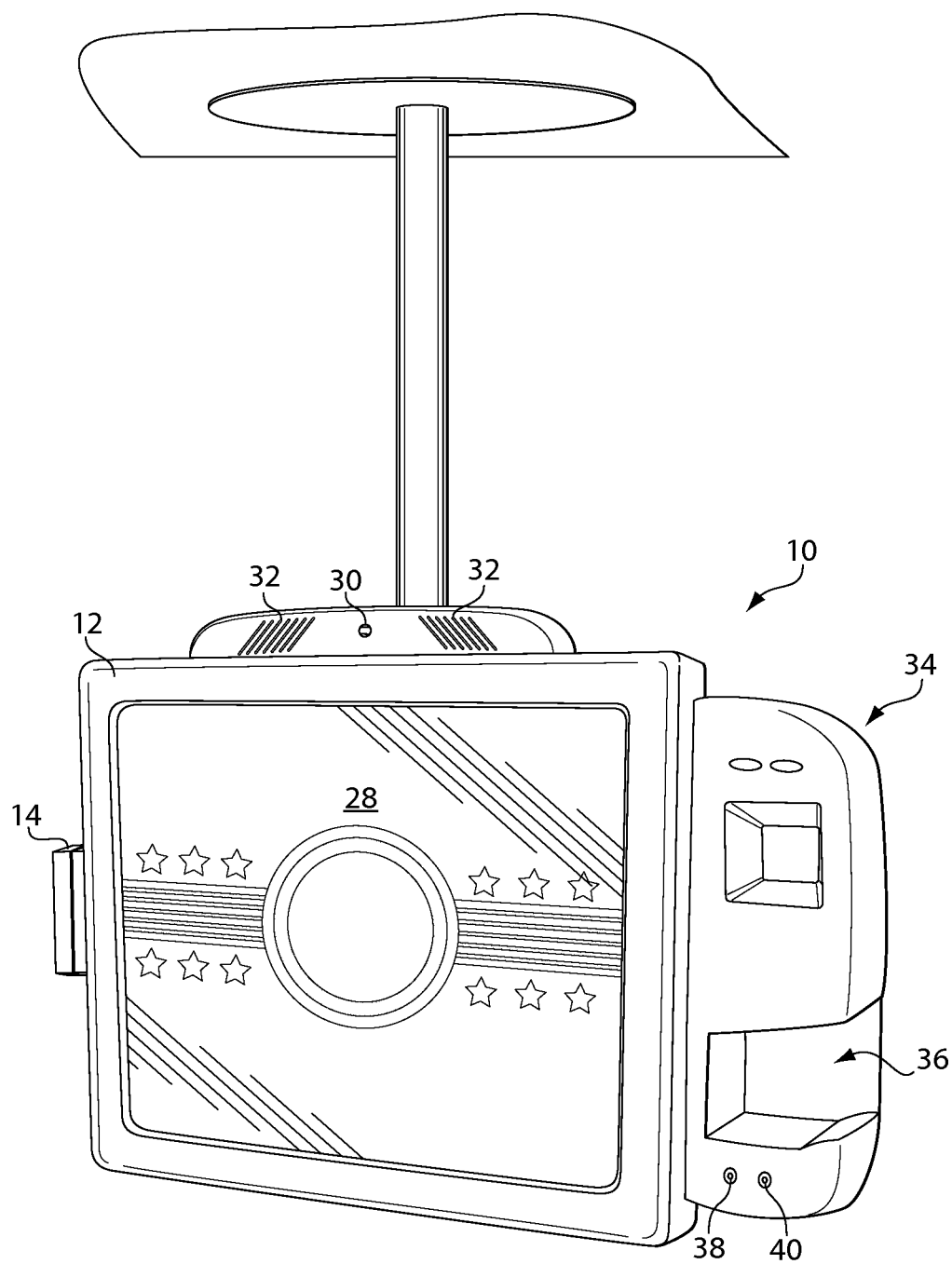
FIG. 4 is a perspective view generally illustrating another embodiment of a reconfigurable user input/output device of the present invention for use in a ceiling mount style of application.
Figure 5:
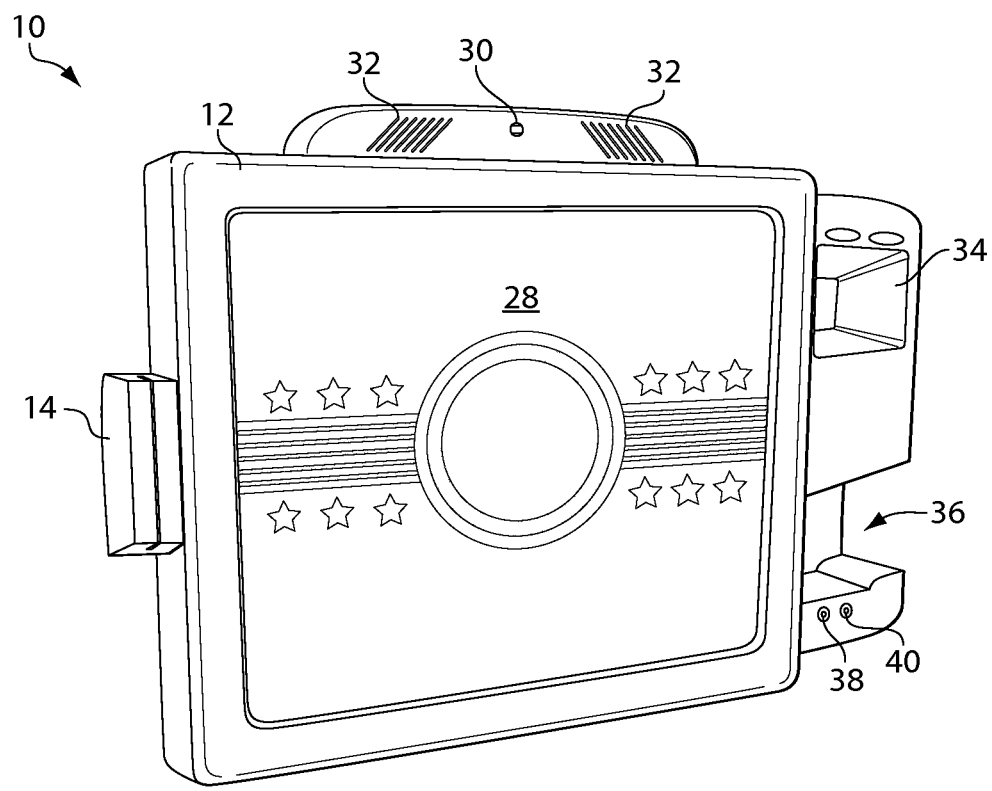
FIG. 5 is a perspective view generally illustrating another embodiment of a reconfigurable user input/output device of the present invention for use in a wall mount type of application.

The housing assembly 12 also enables orientation or mounting in a variety of readily interchangeable applications including, but not limited to, a desk or table top application as illustrated in FIG. 3, a ceiling mount application as illustrated in FIG. 4, a wall mount application as illustrated in FIG. 5, various pedestal applications as illustrated in FIGS. 1, 6, 7 and 8, and a mobile, rolling or wheeled cart application (not illustrated). Additional details of the versatile mounting of the housing 12 will be provided in more detail below.

In FIG. 1, the device 10 is generally illustrated with three potential peripheral devices including a card reader 14, a scanner 16 including an associated card holder or positioner 16a and a printer 18. As described herein, any number of peripherals can be utilized with the device 10 without departing from the teachings of the present invention and the invention is not to be limited in any way to the particular peripherals that may be employed.

Figure 2:
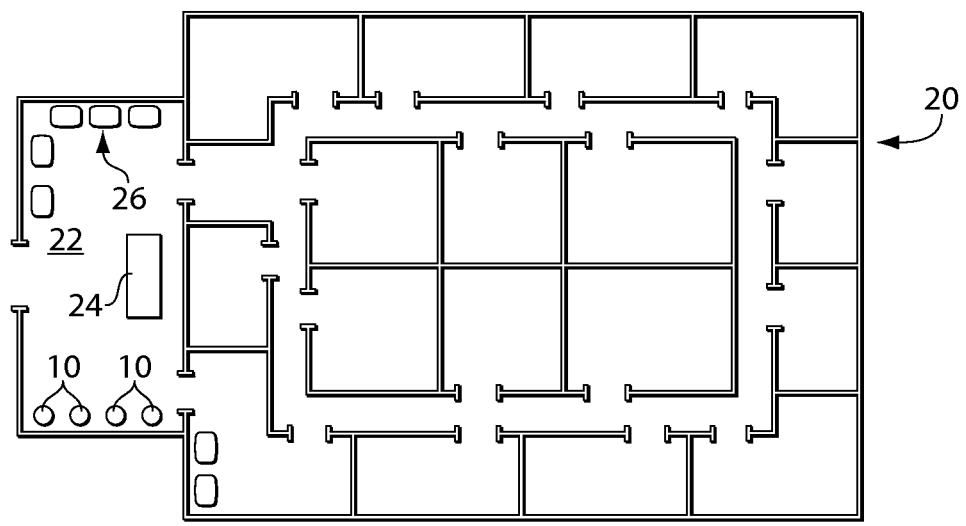
FIG. 2 generally illustrates one embodiment of a facility where the reconfigurable user input/output device of the present invention may be implemented.

As FIG. 2 illustrates, the device 10 typically is utilized with regard to a facility 20 which can be any type of facility desired. In this embodiment, the facility 20 is generally illustrated as some type of medical facility including a check-in area 22 having a check-in desk 24 and a waiting area 26, but can vary.

As FIG. 1 generally illustrates, the device 10 typically includes a display 28 that serves as the main communication interface between the customer and the facility. The display 28 preferably is a touch screen type of display, but any other type of display and user input mechanism can be utilized if desired.

FIGS. 3-8 illustrate a number of additional peripherals that may be included with the device 10 such as a camera 30, one or more speakers 32, a handprint scanner 34, a 2D barcode scanner and insurance card imager 36, and headphone and microphone jacks 38 and 40, to name a few. It is to be understood that the particular number and type of peripheral devices can vary without departing from the teachings of the present invention.

It also is to be understood that peripherals can include any type of peripheral that measures a vital sign of a customer or patient, such as body temperature, blood pressure, pulse, weight, or any other type of vital peripheral. A thermal type of sensor may also be included to measure at least core body temperature and pulse rate, for example.

It is to be noted that the present invention provides a unique secure device 10 with a compact, sleek appearance for use in smaller areas where existing kiosks can't fit. This design not only is appealing to customers and users, but enables placement in many more environments along with enabling more devices 10 to be placed in a designated area.

Additionally, the modular design of the device 10 and various peripherals along with the method of attachment of these peripherals provides a distinct and highly desirable advantage over existing devices. More particularly, the design of the device 10 and attachment mechanisms used to secure the various peripherals to the device 10 are selected so that the peripherals can be secured in more than one position about the periphery of the device 10.

Figure 7:
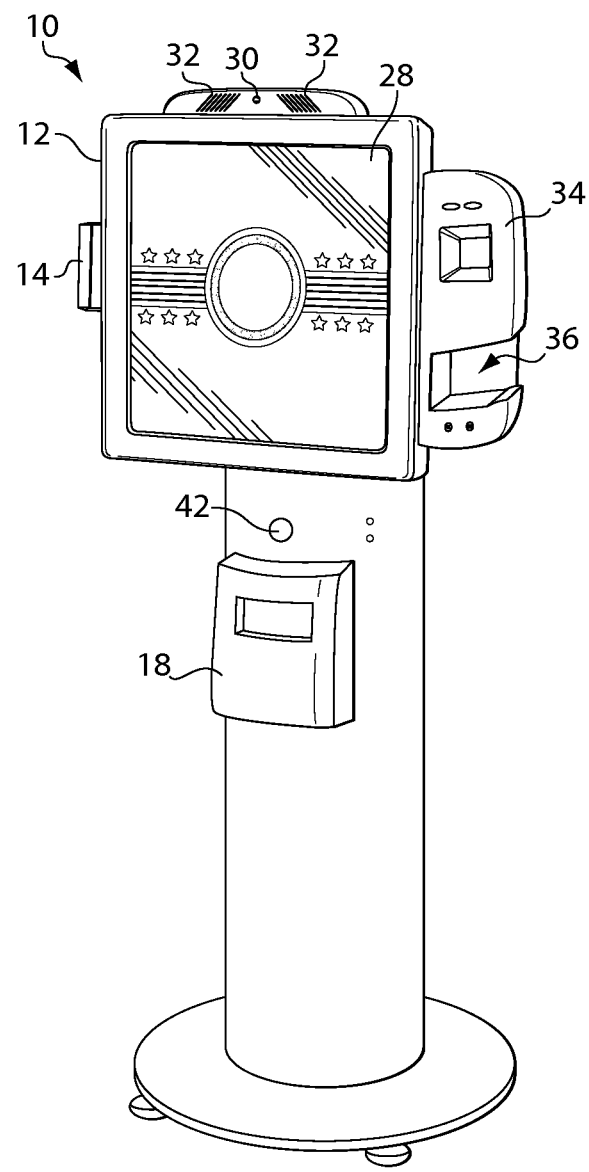
FIG. 7 is a perspective view generally illustrating another embodiment of a reconfigurable user input/output device of the present invention showing a display screen in a portrait orientation.
Figure 8:
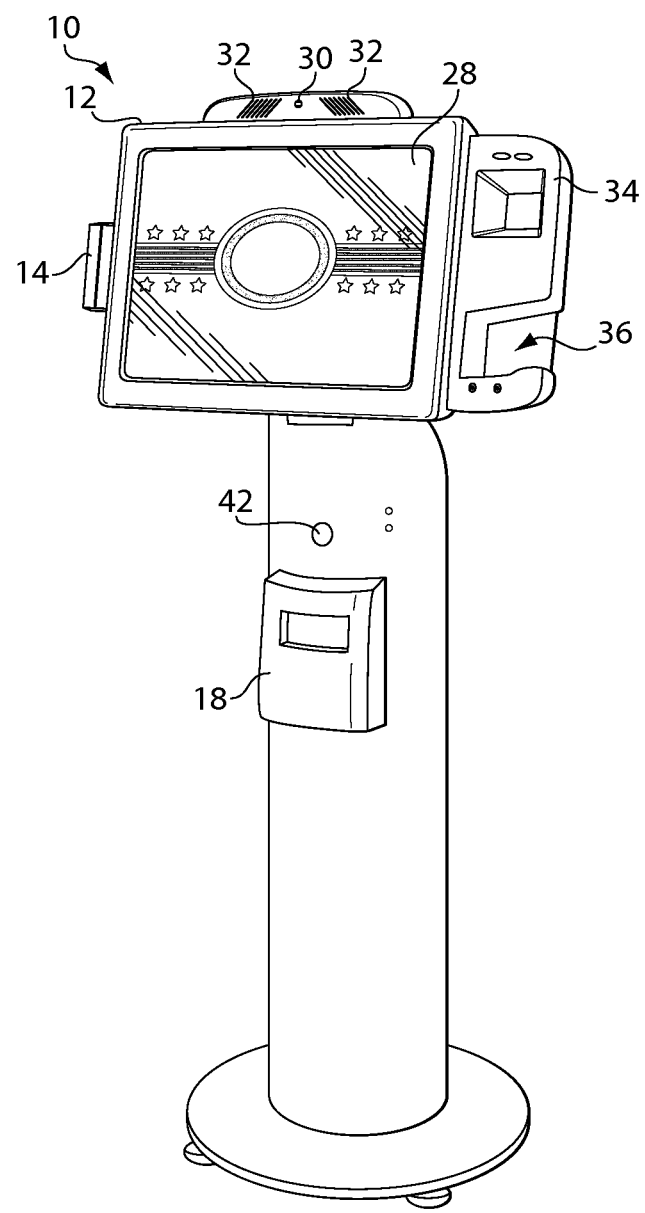
FIG. 8 is a perspective view generally illustrating another embodiment of a reconfigurable user input/output device of the present invention showing a display screen in a landscape orientation.

For example, FIG. 7 illustrates a device 10 with the display 28 positioned in portrait mode where the camera 30 and speakers 32 are secured on the top, shorter side while the card reader 14 and handprint scanner 34 are secured on left and right longer sides, respectively. As FIG. 8 illustrates, the display 28 is positioned in landscape mode with the camera 30 and speakers 32 secured on the top, longer side while the card reader 14 and handprint scanner 34 are secured on left and right shorter sides, respectively.

These unique features of the device 10, among other features, provide a novel versatility to user input/output devices that enable customers to not only customize the device 10 to their particular needs and desires when ordering but enables ready modification, upgrades and addition of more peripherals once installed at a facility by a technician or even the customer to meet changing needs. This versatility is one of many features that have enabled the device 10 to achieve rapid and extensive commercial success, including substantial usage by the U.S. government and top medical facilities.

As mentioned above, this versatility enables significant improvement in the field repair of devices 10, including the display 28 and all peripherals, simply by replacing the desired component with a new component either stocked by the customer at the facility or provided by a service technician. This significantly reduces downtime of the device 10 to reduce costs and inconvenience of the customer. It also enables any self-diagnostic tools of the device 10 to identify potential peripherals for repair and replacement on site as well as enabling any help desk personnel to direct on-site customer personnel to effect repair and replacement on their own.

The particular mounting of each peripheral to the device 10 varies and the claimed invention is not to be limited in any way by the type of mounting provided. The mounting may include particular brackets as well as stands, mounting structures and fasteners for the device 10, display 28 and any other peripheral, as well as brackets, stands and the like for mounting the housing 12 in various positions as desired so long as they provide the desired ready attachment and detachment and easy electrical connection when needed.

Figure 6:
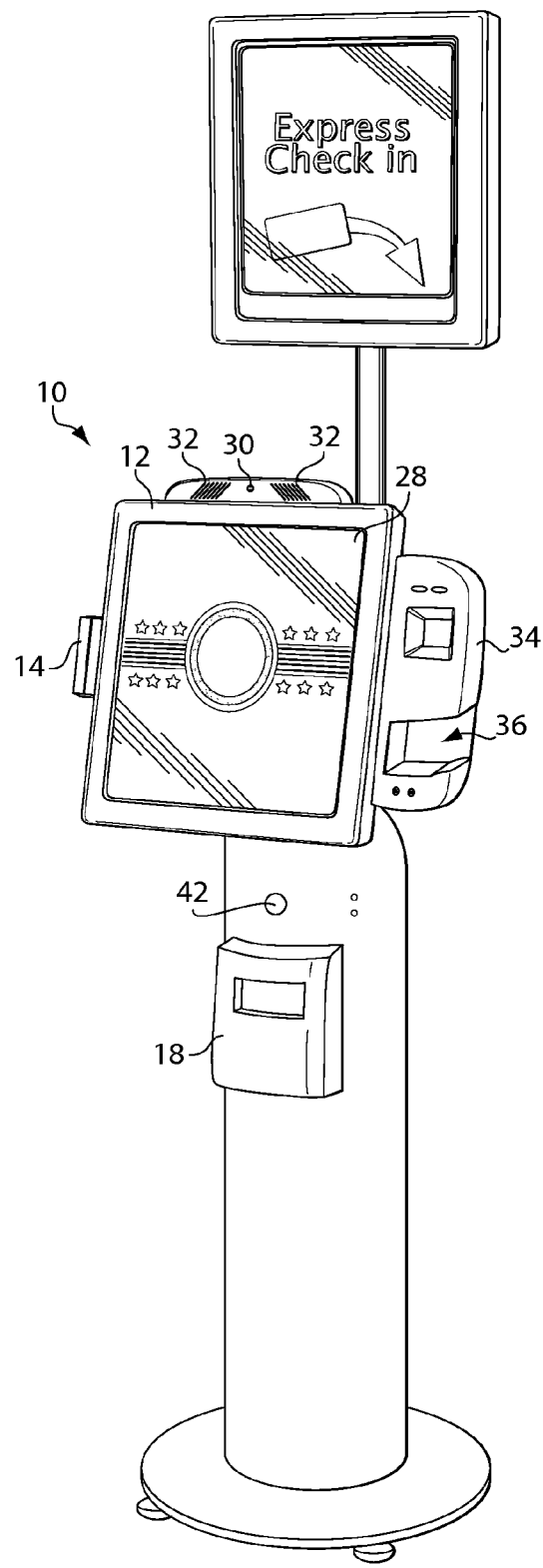
FIG. 6 is a perspective view generally illustrating another embodiment of a reconfigurable user input/output device of the present invention for use in a pedestal type of application and including one embodiment of potential signage that can be included.

To determine the presence of a customer at the kiosk for service, the device 10 may also include a proximity sensor 42, illustrated in FIGS. 6-8. Of course, the proximity sensor 42 can be positioned anywhere on the device 10 and may even be positioned on a mat (not illustrated) on the floor of the device 10 if desired. This feature enables potential power savings of the device, among other benefits, if desired.

The printer 18 can be any type of printer so long as it provides the output desired to a patient. Additionally, for privacy reasons, the printer can be designed to pull the print out back into the device 10 if not retrieved by a customer in a desired time period and disposed of later. Additionally, a full size paper printer can also be included with the device 10 and if desired integrated in the pedestal in a pull out manner (not illustrated) to enable easy servicing and refilling of ink and paper as well as ready replacement of the printer unit if needed.

The embodiments of the present disclosure may be implemented with any combination of hardware and software. If implemented as a computer-implemented apparatus, the embodiments of the present disclosure are implemented using means for performing all of the steps and functions described above.

The embodiments of the present disclosure can be included in an article of manufacture (e.g., one or more computer program products) having, for instance, computer useable media. The media has embodied therein, for example, computer readable program code means for providing and facilitating the mechanisms of the embodiments of the present disclosure. The article of manufacture can be included as part of a computer system or sold separately.

Although the description above contains many specific examples, these should not be construed as limiting the scope of the embodiments of the present disclosure but as merely providing illustrations of some of the presently preferred embodiments of this disclosure. Thus, the scope of the embodiments of the disclosure should be determined by the appended claims and their legal equivalents, rather than by the examples given.

It will be appreciated by those skilled in the art that changes could be made to the embodiments described above without departing from the broad inventive concept thereof. It is understood, therefore, that this disclosure is not limited to the particular embodiments disclosed, but it is intended to cover modifications within the spirit and scope of the embodiments of the present disclosure.

I claim:

1. A readily reconfigurable self-contained self-service user input/output device comprising:
  an input/output assembly accessible by a user, the assembly being readily configurable to be used in more than one type of user configuration or application; and
  a plurality of peripheral devices, each peripheral device in combination with the input/output assembly capable of being removably secured in more than one position about the periphery of the input/output assembly so that each peripheral device can easily be installed during manufacturing in various positions about the input/output assembly as desired by the end user, removed from the periphery of the input/output assembly by an end user and replaced on site by an end user in the event of a failure of the peripheral device or reconfigured on site by the end user to position the peripheral devices in different positions about the periphery of the input/output assembly as desired;
  the device including a pedestal for attaching to and positioning the assembly in a free standing application and a printer secured within the confines of the pedestal, wherein the printer is a printer module releasably secured within the confines of the pedestal and readily can be removed by a customer and replaced with another printer module as desired.

* * * * *